US 6,602,608 B2

(12) United States Patent
Stachowiak

(10) Patent No.: US 6,602,608 B2
(45) Date of Patent: Aug. 5, 2003

(54) COATED ARTICLE WITH IMPROVED BARRIER LAYER STRUCTURE AND METHOD OF MAKING THE SAME

(75) Inventor: Grzegorz Stachowiak, Ann Arbor, MI (US)

(73) Assignee: Guardian Industries, Corp., Auburn Hills, MI (US)

( * ) Notice: Subject to any disclaimer, the term of this patent is extended or adjusted under 35 U.S.C. 154(b) by 0 days.

(21) Appl. No.: 09/986,985

(22) Filed: Nov. 13, 2001

(65) Prior Publication Data

US 2003/0104221 A1 Jun. 5, 2003

Related U.S. Application Data

(60) Provisional application No. 60/331,160, filed on Nov. 9, 2001.

(51) Int. Cl.[7] .............................................. B32B 17/06
(52) U.S. Cl. ..................... 428/432; 428/428; 428/448; 428/469; 428/472; 428/666; 428/667; 428/673; 428/680; 428/697; 428/698; 428/699; 428/701; 428/702; 428/704
(58) Field of Search ................................ 428/428, 432, 428/448, 469, 472, 693, 697, 698, 699, 701, 702, 666, 667, 680

(56) References Cited

U.S. PATENT DOCUMENTS

| | | |
|---|---|---|
| 3,682,528 A | 8/1972 | Apfel et al. |
| 4,744,880 A | 5/1988 | Gillery et al. |
| 4,782,216 A | 11/1988 | Woodard |
| 4,898,789 A | 2/1990 | Finley |
| 4,898,790 A | 2/1990 | Finley |
| 5,028,759 A | 7/1991 | Finley |
| 5,201,926 A | 4/1993 | Szczyrbowski et al. |
| 5,229,194 A | 7/1993 | Lingle et al. |
| 5,298,048 A | 3/1994 | Lingle et al. |
| 5,342,675 A | 8/1994 | Kobayashi et al. |
| 5,344,718 A | 9/1994 | Hartig et al. |
| 5,377,045 A | 12/1994 | Wolfe et al. |
| 5,514,476 A | 5/1996 | Hartig et al. |
| 5,557,462 A | 9/1996 | Hartig et al. |
| 5,563,734 A | 10/1996 | Wolfe et al. |
| 5,584,902 A | 12/1996 | Hartig et al. |
| 5,595,825 A * | 1/1997 | Guiselin ..................... 359/360 |
| 5,688,585 A | 11/1997 | Lingle et al. |
| 5,770,321 A | 6/1998 | Hartig et al. |
| 5,800,933 A | 9/1998 | Hartig et al. |
| 5,811,191 A | 9/1998 | Neuman |
| 5,821,001 A | 10/1998 | Arbab et al. |
| 5,834,103 A | 11/1998 | Bond et al. |
| 5,902,505 A | 5/1999 | Finley |
| 5,942,338 A | 8/1999 | Arbab et al. |
| 6,014,872 A | 1/2000 | Hartig et al. |
| 6,059,909 A | 5/2000 | Hartig et al. |
| 6,060,178 A | 5/2000 | Krisko |
| 6,068,914 A * | 5/2000 | Boire et al. .................. 359/360 |
| 6,114,043 A | 9/2000 | Joret |
| 6,159,607 A | 12/2000 | Hartig et al. |
| 6,340,529 B1 * | 1/2002 | Ebisawa et al. ............. 359/359 |
| 2001/0041252 A1 | 11/2001 | Laird |
| 2002/0031674 A1 | 3/2002 | Laird |

OTHER PUBLICATIONS

U.S. patent application Ser. No. 09/794,224 filed Feb. 28, 2001 (copy attached).

Technical Digest 1995, vol. 17, "Optical Interference Coatings", Wolfe et al., pp. 115–117, Jun.

* cited by examiner

*Primary Examiner*—Deborah Jones
*Assistant Examiner*—A T Piziali
(74) *Attorney, Agent, or Firm*—Nixon & Vanderhye P.C.

(57) ABSTRACT

A coated article, and a corresponding method of making the same are provided. The coated article includes a coating supported by a substrate, the coating including a thin metal or metal nitride contact layer (e.g., NiCr, Ni, Cr, $CrN_x$ or $NiCrN_x$) located directly between and contacting an infrared (IR) reflecting layer (e.g., Ag) and an oxide barrier layer (e.g., $NiCrO_x$).

33 Claims, 3 Drawing Sheets

US 6,602,608 B2

COATED ARTICLE WITH IMPROVED BARRIER LAYER STRUCTURE AND METHOD OF MAKING THE SAME

This application claims priority on Provisional U.S. patent application Ser. No. 60/331,160, filed Nov. 9, 2001, the disclosure of which is hereby incorporated herein by reference.

TITLE OF THE INVENTION

This invention relates to a coated article including a metal or metal nitride layer provided between an IR reflecting layer (e.g., Ag layer) and an oxide barrier layer (e.g,. $NiCrO_x$), and a method of making the same.

BACKGROUND OF THE INVENTION

Coated articles provided for solar control purposes are known in the art. For example, see U.S. Pat. No. 5,344,718, which discloses a layer stack of: glass/$Si_3N_4$/NiCr/Ag/NiCr/$Si_3N_4$. In coatings such as this, NiCr barrier layers are commonly used to protect the Ag (silver) in low-E type coatings.

Unfortunately, metallic NiCr is characterized by high absorption which reduces transmittance of the final coated article. Due to this high absorption problem, those in the art desiring products with high visible transmission have been forced to use very thin NiCr barrier layers. For example, the NiCr layers in the aforesaid '718 patent are "less than about 7 Å" thick, in order to obtain the desired visible transmission. The thinner such layers are, the less barrier functionality and protection they provide. Consequently, those skilled in the art have been seeking to increase barrier layer transmission by introducing oxygen and/or nitrogen to NiCr barrier layers (e.g., see U.S. Pat. No. 6,014,872 at col. 4, lines 40–50).

Consider a layer stack of glass/$Si_3N_4$/$NiCrO_x$/Ag/$NiCrO_x$/$Si_3N_4$. While the $NiCrO_x$ protective barrier layers are more transparent than NiCr protective barrier layers, they have their problems. For instance, the use of $NiCrO_x$ protective barrier layers contacting the Ag layer on respective sides thereof can sometimes lead to problems with respect to durability and/or heat treatability. It is believed that during deposition (e.g., via sputtering) of a coating including $NiCrO_x$ protective barrier layers, the Ag layer is exposed to the oxygen plasma (and thus chemically active atomic oxygen in that plasma) used in depositing the $NiCrO_x$; this is especially true with respect to the top surface of the Ag layer when an upper $NiCrO_x$ protective barrier is applied directly thereto. The exposure of the Ag to this oxygen inclusive plasma is believed to sometimes lead to Ag adhesion problems.

In view of the above, it will be apparent to those skilled in the art that there exists a need for an improved barrier layer(s) structure for protecting an IR reflecting layer (e.g., Ag).

BRIEF SUMMARY OF THE INVENTION

An object of this invention is to provide an improved barrier layer(s) structure for protecting an IR reflecting layer such as Ag in a coated article, and a corresponding method of making the same.

Another object of this invention is to provide a barrier layer(s) structure which is capable of protecting an IR reflecting layer, and which is both fairly transmissive to visible light and enables a durable final coated article.

Another object of this invention is to fulfill one or more of the above listed objects and/or needs.

In certain example embodiments of this invention, one or more of the above-listed objects and/or needs is/are fulfilled by providing a coated article comprising: a glass substrate; a coating supported by the glass substrate, wherein the coating comprises a first dielectric layer, a first $NiCrO_x$ inclusive layer, an Ag inclusive layer, a second $NiCrO_x$ inclusive layer, and a second dielectric layer, wherein the Ag inclusive layer is located between the first and second $NiCrO_x$ inclusive layers; and wherein the coating further includes a metal or metal nitride protective contact layer located between and contacting the Ag layer and one of the $NiCrO_x$ inclusive layers.

In other example embodiments of this invention, one or more of the above-listed objects and/or needs is/are fulfilled by providing a coated article including a coating supported by a substrate, the coating comprising: a $NiCrO_x$ inclusive layer; an Ag inclusive layer; and a metal or metal nitride layer located between and contacting each of the $NiCrO_x$ inclusive layer and the Ag inclusive layer.

In other example embodiments of this invention, one or more of the above-listed objects and/or needs is/are fulfilled by providing a coated article including a coating supported by a substrate, the coating comprising: an oxide layer including an oxide of a metal or metal alloy; a metallic infrared (IR) reflecting layer; a metal or metal nitride protective contact layer located between and contacting each of the metallic IR reflecting layer and the oxide layer; and wherein the metal or metal nitride contact layer comprises the same metal or metal alloy as is in the oxide layer.

In still further embodiments of this invention, one or more of the above-listed objects and/or needs is/are fulfilled by providing a method of making a coated article, the method comprising: providing a glass substrate; depositing a first dielectric layer so as to be supported by the substrate; depositing an Ag layer on the substrate over the first dielectric layer; depositing a metal or metal nitride contact layer on the substrate directly over and in contact with the Ag layer; depositing a layer comprising $NiCrO_x$ on the substrate directly over and in contact with the metal or metal nitride contact layer; and depositing another dielectric layer on the substrate over the layer comprising $NiCrO_x$.

DETAILED DESCRIPTION OF EXAMPLE EMBODIMENTS OF THE INVENTION

Figure 1:
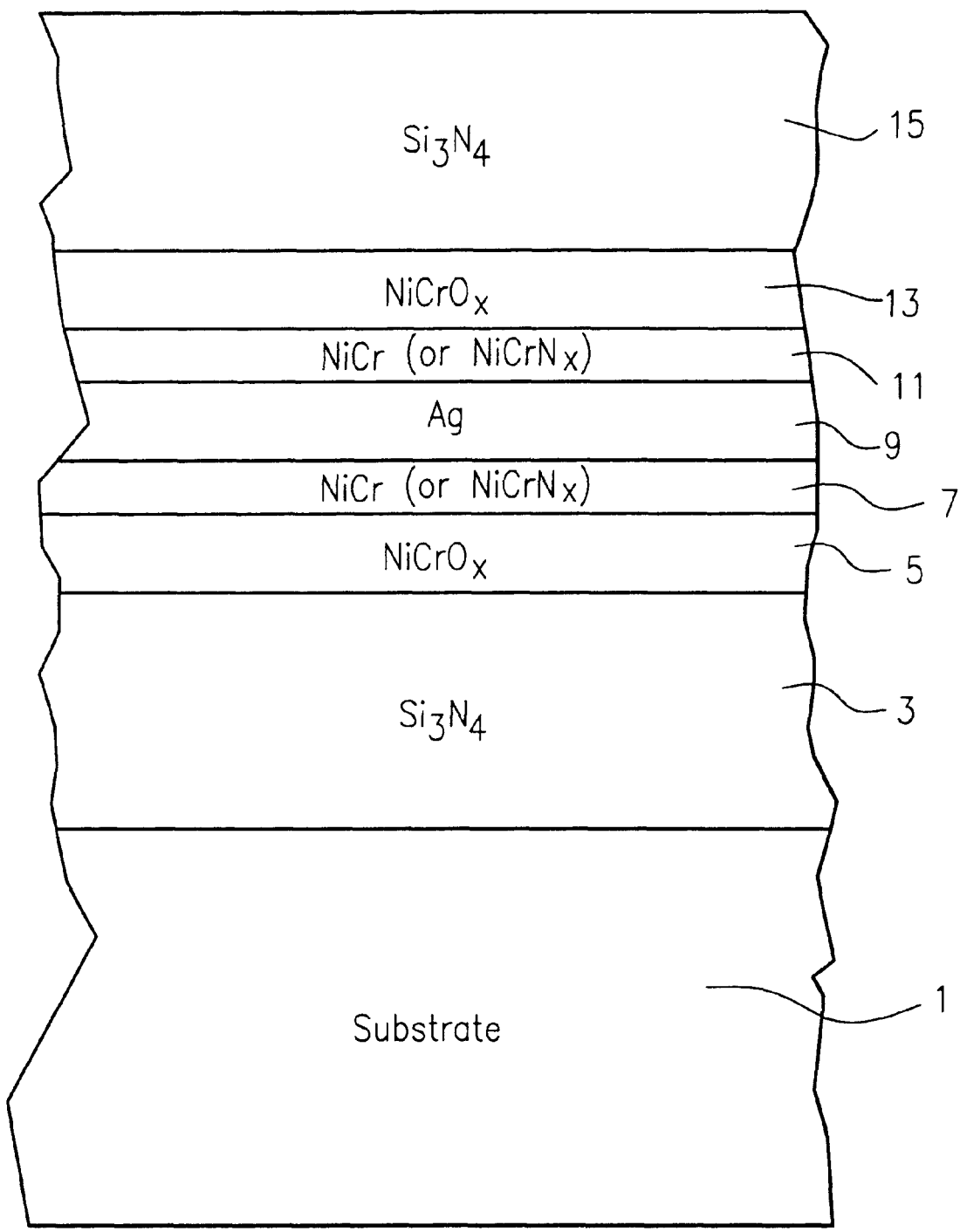
FIG. 1 is a cross sectional view of a coated article according to an embodiment of this invention.

Referring now more particularly to the accompanying drawings in which like reference numerals indicate like parts throughout the several views.

Coated articles according to different embodiments of this invention may be used in the context of architectural windows (e.g., IG units), automotive windows, or any other suitable application. Coated articles herein may or may not be heat treated (e.g., thermally tempered, heat bent, or the like) in different embodiments of this invention.

FIG. 1 is a side cross sectional view of a coated article according to an embodiment of this invention. The coated article includes substrate 1 (e.g., clear, green, bronze, or blue-green glass substrate from about 1.0 to 10.0 mm thick, more preferably from about 1.8 mm to 4 mm thick), first dielectric layer 3, lower barrier layer 5, lower barrier contact layer 7 (which contacts IR reflecting layer 9), first conductive metallic infrared (IR) reflecting layer 9, upper barrier contact layer 11 (which contacts IR reflecting layer 9), upper barrier layer 13, and upper dielectric layer 15. The "contact" layers 7 and 11 each contact IR reflecting layer 9. Example non-limiting materials for layers 3–15 are illustrated in FIG. 1. The aforesaid layers 3–15 make up a solar control coating (e.g., a low-E or low emissivity type coating) which may be provided on glass or plastic substrates 1. The layer stack 3–15 illustrated in FIG. 1 may, in certain alternative embodiments of this invention, be repeated on substrate 1 one or more times (e.g., another layer stack 3–15 may be provided on top of the stack shown in FIG. 1 on the same substrate—this applies to any and all embodiments herein).

In certain embodiments of this invention, first dielectric layer 3 may be of or include titanium dioxide ($TiO_x$ where x is from 1.7 to 2.7, most preferably 2.0 to 2.6), silicon nitride ($Si_xN_y$ where x/y may be about 0.75 (i.e., $Si_3N_4$), or alternatively x/y may be from about 0.76 to 1.5 in Si-rich embodiments), silicon dioxide ($SiO_x$ where x is from 1.7 to 2.3, most preferably about 2.0), niobium oxide (e.g., $Nb_2O_5$), SiZrN, tin oxide, zinc oxide, silicon oxynitride, or any other suitable dielectric material. First dielectric layer 3 may function as an antireflection and/or color modifying layer in certain embodiments of this invention.

Infrared (IR) reflecting layer 9 is preferably metallic and conductive, and may be made of or include silver (Ag), gold (Au), or any other suitable IR reflecting material. However, metallic Ag is the material of choice for IR reflecting layer 9 in certain example embodiments of this invention. The IR reflecting layer(s) helps enable the coating to have low-E characteristics.

Barrier layers 5 and 13 are preferably at least partially oxidized, and in certain embodiments of this invention are of or include nickel (Ni) oxide, or a nickel alloy oxide such as nickel chrome oxide ($NiCrO_x$), or any other suitable material(s). In the FIG. 1 embodiment, layers 5 and 13 comprise $NiCrO_x$ which may be either fully oxided/oxidized or only partially oxidized. In particular, $NiCrO_x$ layers 5 and 13 may be fully oxidized in certain embodiments of this invention (i.e., fully stochiometric), or may be at least about 75% oxidized in other embodiments of this invention. While $NiCrO_x$ is a preferred material for barrier layers 5 and 13, those skilled in the art will recognized that other materials may instead be used (e.g., oxides of Ni, oxides of Ni alloys, oxides of Cr, oxides of Cr alloys, $NiCrO_xN_y$, $NiCrN_x$, $NbO_x$ or any other suitable material) for one or more of these layers. It is noted that barrier layers 5 and 13 may or may not be continuous in different embodiments of this invention.

Still referring to barrier layers 5 and 13, these layers may or may not be oxidation graded in different embodiments of this invention. In some embodiments, barrier layers 5 and 13 are approximately uniformly oxidized throughout their respective thicknesses (i.e., no grading). However, in other embodiments, barrier layers 5 and 13 may be oxidation graded so as to be less oxidized at the contact interface with the immediately adjacent contact layer(s) 7, 11 than at a portion of the barrier layer(s) further or more/most distant from the immediately adjacent contact layer. This may improve adhesion of the metal or metal nitride contact layers 7, 11 to the barrier layers 5, 13, respectively. Such grading may also enable the coating, in certain example non-limiting embodiments, to achieve the combination of heat treatability and high visible transmission. For a more detailed discussion of how layers 5 and/or 13 may be oxidation graded, see pending U.S. Ser. No. 09/794,224, the disclosure of which is hereby incorporated herein by reference.

Contact layers 7 and 11 (which contact IR reflecting layer 9) are preferably more metallic and/or less oxidized than their respective adjacent barrier layers 5 and 13. For example, in certain embodiments of this invention, contact layers 7 and 11 may be of or include Ni, Cr, NiCr, $CrN_x$ or $NiCrN_x$ (it is noted that the term $NiCrN_x$ as used herein includes situations where the Ni in the layer is metallic and the nitriding is mostly with respect to the Cr). In such embodiments, layers 7 and 11 are either not oxidized, or only slightly oxidized to an extent significantly less than barrier layers 5 and 13. Thus, in certain preferred example embodiments of this invention, contact layers 7 and/or 11 are substantially free of oxygen (i.e., less than about 10% oxidized), or are even oxidized from only 0–5% in certain embodiments.

Surprisingly, it has been found that by providing thin metal or metal-nitride protective contact layers 7 and 11 (e.g., NiCr, Ni, Cr, $CrN_x$, Nb, or $NiCrN_x$) on the substrate between the IR reflecting layer 9 (e.g., Ag) and the respective barrier layers 5 and 13 (e.g., $NiCrO_x$), durability can be improved compared to a situation where $NiCrO_x$ barrier layers 5 and 13 where entirely in direct contact with Ag layer 9. The use of thin metal or metal nitride contact layers 7 and/or 11 in contact with barrier layers 5 and/or 13 enables the resulting coated article to have both a high visible transmission (e.g., at least 70% in certain example embodiments), and be durable both before and/or after heat treatment. It is noted that metal or metal nitride contact layers 7 and 11 are provided to be rather thin (to reduce adverse affects of visible light absorption) in certain embodiments, so that the contact layers 7 and 11 may or may not be continuous in different embodiments of this invention.

When NiCr is used in layers 5, 7, 11 and/or 13 in certain embodiments of this invention (i.e., when a NiCr target is used in sputtering any of these layers regardless of whether they are oxided, nitrided, or neither), the Ni and Cr may be provided in different amounts, such as in the form of nichrome by weight about 80–90% Ni and 10–20% Cr. An exemplary sputtering target for depositing these layers includes not only SS-316 which consists essentially of 10% Ni and 90% other ingredients, mainly Fe and Cr, but Inconel and Haynes 214 alloy as well, which by weight consists essentially of (as a nominal composition) the following materials which may also show up in these layers: Ni: 75.45%; Fe: 4%; Cr: 16%; C: 0.04%; Al: 4.5%; and Y:0.01%. In other embodiments, the NiCr target may be 50/50 Ni/Cr, or any other suitable ratio.

Still referring to FIG. 1, while various materials and/or thicknesses may be used consistent with one or more of the objects discussed herein, exemplary preferred thicknesses and materials for the respective layers on the glass substrate 1 in the FIG. 1 embodiment are as follows:

TABLE 1

(Example Materials/Thicknesses; FIG. 1 Embodiment)

| Layer | Preferred Range (Å) | More Preferred (Å) | Example (Å) |
|---|---|---|---|
| $Si_xN_y$ (layer 3) | 0–600 Å | 300–500 Å | 410–520 Å |
| $NiCrO_x$ (layer 5) | 5–100 Å | 10–50 Å | 15–30 Å |
| NiCr (layer 7) | 1–25 Å | 1–10 Å | 3–4 Å |
| Ag (layer 9) | 50–250 Å | 80–160 Å | 100–140 Å |
| NiCr (layer 11) | 1–25 Å | 1–10 Å | 3–4 Å |
| $NiCrO_x$ (layer 13) | 5–100 Å | 10–50 Å | 15–25 Å |
| $Si_xN_y$ (layer 15) | 0–800 Å | 300–600 Å | 410–540 Å |

Other layer(s) below or above the illustrated coating may also be provided. Thus, while the FIG. 1 layer system or coating is "on" or "supported by" substrate 1 (directly or indirectly), other layer(s) may be provided therebetween.

Thus, for example, the coating of FIG. 1 may be considered "on" and "supported by" the substrate 1 even if other layer(s) are provided between layer 3 and substrate 1. Moreover, certain layers of the coating may be removed in certain embodiments, while others may be added in other embodiments of this invention without departing from the overall spirit of certain embodiments of this invention.

Figure 2:
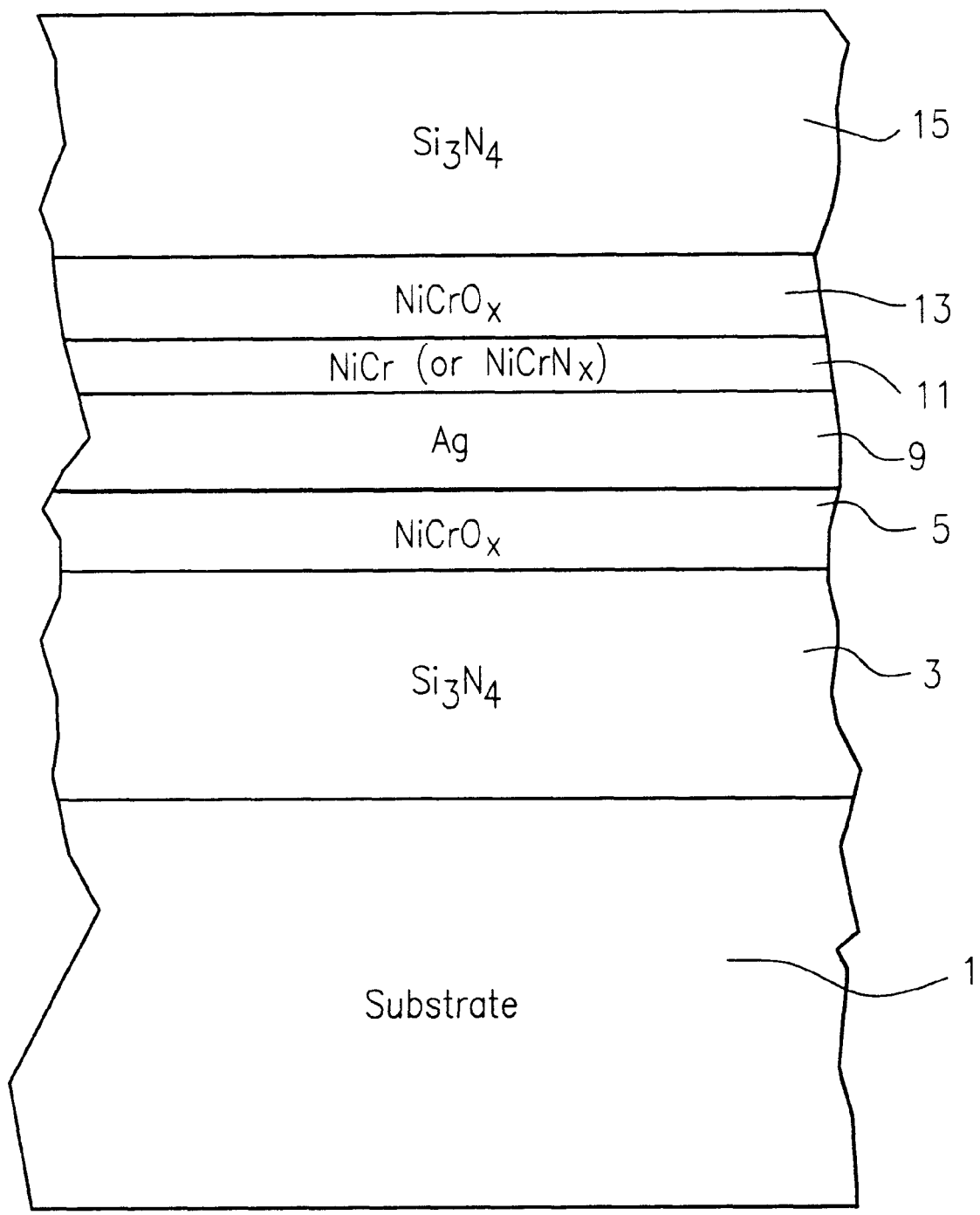
FIG. 2 is a cross sectional view of a coated article according to another embodiment of this invention.

FIG. 2 is a cross sectional view of a coated article according to another embodiment of this invention. The FIG. 2 embodiment is the same as the FIG. 1 embodiment, except that lower contact layer 7 from the FIG. 1 embodiment is not present in the FIG. 2 embodiment. In particular, a metal or metal nitride contact layer 11 is provided only on the upper side of Ag layer 9 because this is where the Ag layer is most susceptible to problems arising from exposure to oxygen plasma as discussed above. In still further, but less preferred, embodiments of this invention, a metal or metal nitride contact layer may be provided on the bottom of Ag layer 9 but not on top of layer 9 (i.e., the inverse of FIG. 2). In the FIG. 2 embodiment, those skilled in the art will recognize that layer 5 need not be $NiCrO_x$, but instead may be any other suitable material including but not limited to an oxide of titanium (e.g., $TiO_2$), $ZnAlO_x$, or the like.

Figure 3:
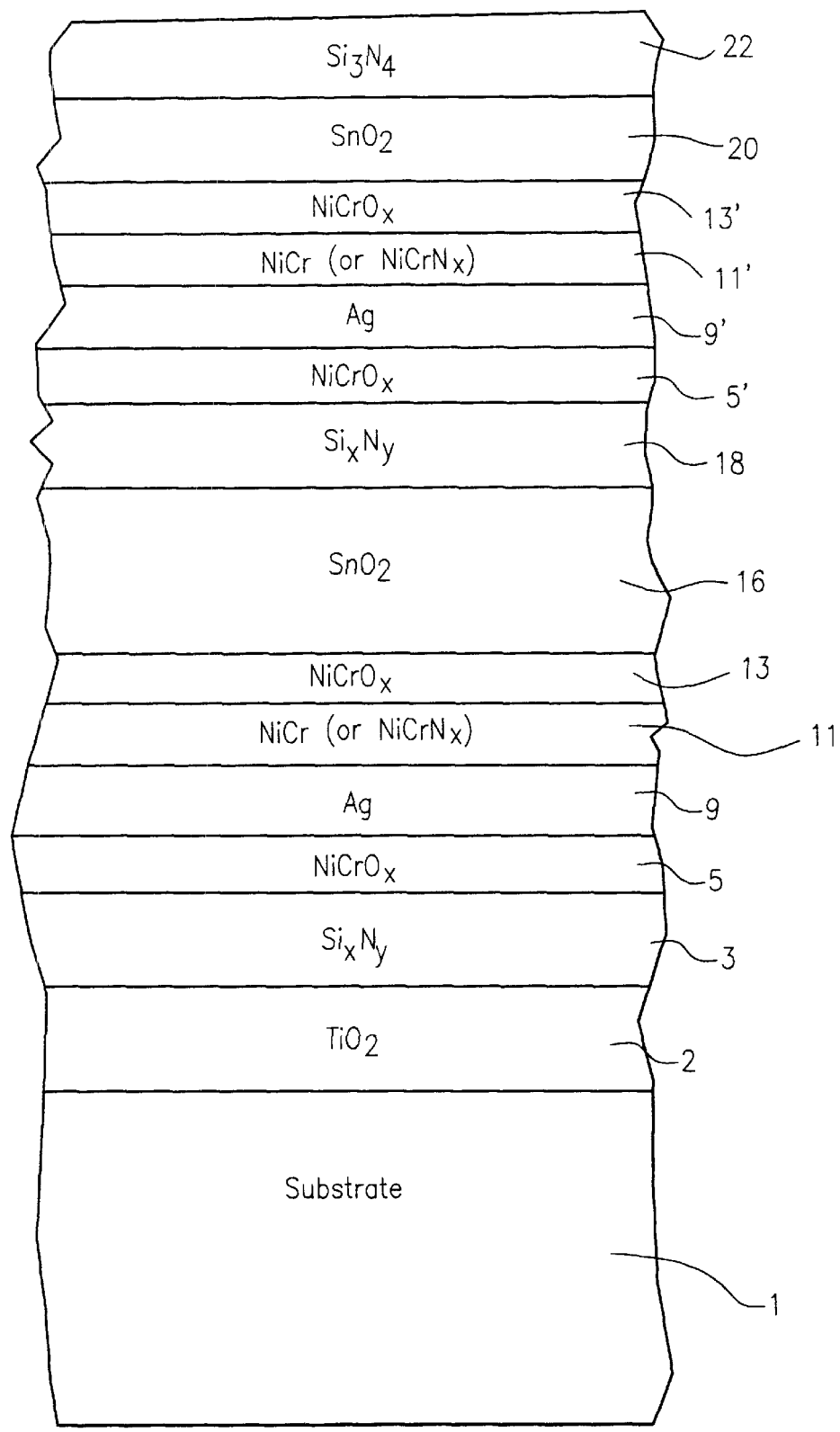
FIG. 3 is a cross sectional view of a coated article according to yet another embodiment of this invention.

FIG. 3 is a cross sectional view of yet another embodiment of this invention where metal or metal nitride contact layer(s) 7 and/or 11 can be used. It will be appreciated by those skilled in the art that these layers may be used in a variety of different coating stacks, and dielectric materials of the coating(s) and the number of IR reflecting layer(s) of the coating, are not always of particular relevance with respect to the contact layers described herein. While a metal or metal nitride contact layer (contact layer 11 over the bottom Ag layer 9, and contact layer 11' over the top Ag layer 9'), in other embodiments of this invention metal or metal nitride contact layer(s) may be provided below one or both of these Ag layer(s) as well (e.g., see contact layer 7 in FIG. 1). In the FIG. 3 embodiment, example materials and thicknesses (which are of course non-limiting) are provided below in Table 2.

TABLE 2

(Example Materials/Thicknesses; FIG. 3 Embodiment)

| Layer | Preferred Range (Å) | More Preferred (Å) | Example (Å) |
|---|---|---|---|
| $TiO_2$ (layer 2) | 0–400 Å | 50–250 Å | 100–160 Å |
| $Si_xN_y$ (layer 3) | 0–500 Å | 50–400 Å | 170–360 Å |
| $NiCrO_x$ (layer 5) | 5–100 Å | 10–50 Å | 15–30 Å |
| Ag (layer 9) | 50–250 Å | 80–120 Å | 105 Å |
| NiCr (layer 11) | 1–25 Å | 1–10 Å | 3–4 Å |
| $NiCrO_x$ (layer 13) | 5–100 Å | 10–50 Å | 15–30 Å |
| $SnO_2$ (layer 16) | 0–800 Å | 500–850 Å | 650 Å |
| $Si_xN_y$ (layer 18) | 0–800 Å | 50–250 Å | 170 Å |
| $NiCrO_x$ (layer 5') | 5–100 Å | 10–50 Å | 15–30 Å |
| Ag (layer 9') | 50–250 Å | 80–120 Å | 105 Å |
| NiCr (layer 11') | 1–25 Å | 1–10 Å | 3–4 Å |
| $NiCrO_x$ (layer 13') | 5–100 Å | 10–50 Å | 15–30 Å |
| $SnO_2$ (layer 20) | 0–500 Å | 100–300 Å | 150 Å |
| $Si_3N_4$ (layer 22) | 0–500 Å | 100–300 Å | 250 Å |

An example of the FIG. 1 embodiment of the instant invention was made and tested, as set forth below. During the sputter coating process in which layers 3–15 were deposited: the line speed for lower silicon nitride layer 3 (using a Si sputtering target) was 55 inches/minute using 8 passes, the line speed for upper silicon nitride layer 15 (using a Si sputtering target) was 50 inches/minute using 8 passes; the line speed for the NiCr contact layers 7 and 11 was 100 inches/minute using 1 pass; and the line speed for the $NiCrO_x$ barrier layers 5 and 13 was 37.5 inches/minute using 2 passes.

COATER SET-UP FOR EXAMPLE OF FIG. 1 EMBODIMENT

| Target Mat'l | Power (kW) | Volts (V) | Ar (sccm) | $O_2$ (sccm) | $N_2$ (sccm) | Thickness (Å) |
|---|---|---|---|---|---|---|
| Si (layer 3) | 1 kW | 485 V | 40 | 0 | 40 | 470 Å |
| NiCr (layer 5) | 1 kW | 415 V | 40 | 10 | 0 | 22 Å |
| NiCr (layer 7) | 0.38 kW | 370 V | 30 | 0 | 0 | 3 Å |
| Ag (layer 9) | 2.95 kW | 465 V | 30 | 0 | 0 | $R_s$ = 16 ohm/sq. |
| NiCr (layer 11) | 0.38 kW | 370 V | 30 | 0 | 0 | 3 Å |
| NiCr (layer 13) | 1 kW | 415 V | 40 | 10 | 0 | 22 Å |
| Si (layer 15) | 1 kW | 485 V | 40 | 0 | 40 | 510 Å |

As will be appreciated by those skilled in the art, the aforesaid coater set-up resulted in a layer stack on glass substrate 1 of (from the substrate outwardly): $Si_3N_4$/$NiCrO_x$/NiCr/Ag/NiCr/$NiCrO_x$/$Si_3N_4$. Of course, in alternative embodiments of this invention contact layer(s) 7 and/or 11 could be nitrided (fully or only partially) by adding nitrogen gas to the sputter coating process of those layers 7 and/or 11. Optical characteristics of this particular example were measure as follows (Ill. C, 2 degree observer technique was used for transmission characteristics):

OPTICAL CHARACTERISTICS OF EXAMPLE

| | |
|---|---|
| Transmission (TY) %: | 81.25% |
| $a*_T$: | −2.24 |
| $b*_T$: | 0.81 |
| Reflectance as viewed from glass (G) side: $R_GY$ (%): | 7.54 |
| $L*_G$: | 33.01 |
| $a*_G$: | 0.56 |
| $b*_G$: | −7.13 |
| Reflectance as viewed from film/coating (F) side: $R_FY$ (%): | 5.07 |
| $a*_F$: | 3.21 |
| $b*_F$: | −5.30 |
| $R_S$ (sheet resistance in ohms/sq.): | 16.0 |

This example was characterized by better durability than a comparative example where the metal contact layers were omitted.

Coated articles according to certain embodiments of this invention have a visible transmission of at least 65%, more preferably of at least 70%, and most preferably of at least 75%, and even sometimes at least 80%. Moreover, coated articles according to certain example embodiments of this invention have a sheet resistance ($R_s$) of no greater than 20 ohms/sq., more preferably no greater than 16 ohms/sq., and sometimes no greater than 12 ohms/sq.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A heat treated coated article comprising:
   a glass substrate;

a coating supported by the glass substrate, wherein the coating comprises a first dielectric layer, an Ag inclusive layer, a layer comprising an oxide of NiCr, and a second dielectric layer, wherein the Ag inclusive layer is located between the first dielectric layer and the layer which comprise an oxide of NiCr; and wherein the coating further includes a metal or metal nitride contact layer located directly between and contacting each of the Ag inclusive layer and the layer comprising an oxide of NiCr, wherein said metal or metal nitride contact layer is more metallic than said adjacent layer comprising an oxide of NiCr.

2. The coated article of claim 1, wherein the contact layer is on an upper side of the Ag inclusive layer, and is metallic and consists essentially of nickel.

3. The coated article of claim 1, wherein the layer comprising an oxide of NiCr is located directly between and contacting each of a layer comprising silicon nitride and said contact layer.

4. The coated article of claim 1, wherein the contact layer comprises a nitride of NiCr and is less oxidized than said layer comprising an oxide or NiCr that the contact layer is in contact with.

5. The coated article of claim 1, wherein the layer comprising an oxide of NiCr is more metallic at a location closer to the silver inclusive layer than at another location further from the silver inclusive layer.

6. The coated article of claim 1, wherein the metal or metal nitride contact layer comprises at least one of Ni and a nitride of NiCr.

7. The coated article of claim 1, wherein the coated article has a visible transmission of at least 70%.

8. The coated article of claim 7, wherein the coated article has a visible transmission of at least 75%.

9. The coated article of claim 1, where the coating has a sheet resistance ($R_S$) of no greater than 20 ohms/sq.

10. The coated article of claim 1, wherein the first dielectric layer comprises silicon nitride.

11. The coated article of claim 10, wherein the second dielectric layer comprises silicon nitride.

12. The coated article of claim 1, wherein the first dielectric layer comprises an oxide of titanium.

13. The coated article of claim 1, wherein the contact layer is provided on the upper surface of the Ag inclusive layer.

14. A heat treated coated article including a coating supported by a substrate, the coating comprising:
    a layer comprising an oxide of NiCr;
    an Ag inclusive layer; and
    a metal or metal nitride layer located between and contacting each of the layer comprising an oxide of NiCr and the Ag inclusive layer, wherein the metal or metal nitride layer is more metallic than is the layer comprising an oxide of NiCr.

15. The coated article of claim 14, wherein the layer comprising an oxide of NiCr is oxidation graded so as to be more metallic at a location closer to the metal or metal nitride layer than at a location further from the metal or metal nitride layer.

16. The coated article of claim 14, wherein the metal or metal nitride layer is of at least one of Ni, a nitride of Cr, and a nitride of NiCr.

17. The coated article of claim 14, wherein the coating has a sheet resistance ($R_S$) of no greater than 20 ohms/sq.

18. A heat treated coated article including a coating supported by a substrate, the coating comprising:
    an oxide layer including an oxide of a metal or metal alloy;
    an infrared (IR) reflecting layer;
    a metal or metal nitride contact layer located between and contacting each of the IR reflecting layer and the oxide layer;

wherein the oxide layer is more metallic at a location closer to the metal or metal nitride contact layer than at another location further from the metal or metal nitride contact layer; and wherein the metal or metal nitride contact layer comprises at least one metal which is also in the oxide layer.

19. The coated article of claim 18, wherein the oxide layer comprises an oxide of NiCr, and wherein the metal or metal nitride contact layer comprises Ni so that said at least one metal that the contact layer and the oxide layer have in common comprises Ni.

20. The coated article of claim 19, wherein the IR reflecting layer comprises Ag.

21. The coated article of claim 18, wherein the metal or metal nitride contact layer is metallic and is of Ni, and is located on an upper side of the IR reflecting layer, and wherein the IR reflecting layer comprises Ag.

22. The coated article of claim 18, wherein the coated article is characterized by a sheet resistance ($R_S$) of no greater than 20 ohms/sq., and a visible transmission of at least 70%.

23. The coated article of claim 1, wherein the metal or metal nitride contact layer is of a lesser thickness than the layer comprising an oxide of NiCr.

24. The coated article of claim 1, wherein the metal or metal nitride contact layer is from about 1–10 Å thick, and the layer comprising an oxide of NiCr is from about 10–50 Å thick.

25. The coated article of claim 14, wherein the metal or metal nitride layer is from about 1–10 Å thick, and the layer comprising an oxide of NiCr is from about 10–50 Å thick.

26. The coated article of claim 18, wherein the metal or metal nitride contact layer is from about 1–10 Å thick, and the oxide layer which contacts the metal or metal nitride contact layer is from about 10–50 Å thick.

27. The coated article of claim 1, wherein the contact layer is substantially free of oxygen.

28. The coated article of claim 14, wherein the metal or metal nitride layer is oxidized from 0–5%.

29. The coated article of claim 14, wherein the contact layer has at least one metal in common with the layer comprising an oxide of NiCr which is in a contact with the contact layer.

30. The coated article of claim 14, wherein the metal or metal nitride layer has at least one metal in common with the layer comprising an oxide of NiCr which is in contact with the metal or metal nitride layer.

31. A heat treated coated article comprising:
    a glass substrate;
    a coating supported by the glass substrate, wherein the coating comprises a first dielectric layer, an Ag inclusive layer, a layer comprising an oxide of NiCr, and a second dielectric layer, wherein the Ag inclusive layer is located between the first dielectric layer and the layer comprising an oxide of NiCr;
    wherein the coating further includes a contact layer comprising a metal located between and contacting the Ag inclusive layer and the layer comprising an oxide of NiCr; and
    wherein the layer comprising an oxide of NiCr is oxidation graded so as to be more metallic at a location closer to the contact layer than at another location further from the contact layer.

32. The coated article of claim 31, wherein the contact layer is metallic and is of Ni.

33. The coated article of claim 31, wherein the contact layer is more metallic and less oxidized than is the layer comprising an oxide of NiCr.

* * * * *